United States Patent [19]

Yamamoto

[11] 4,205,333
[45] May 27, 1980

[54] LATERAL TRANSISTOR WITH MULTI-BASE CONTACTS

[75] Inventor: Yousuke Yamamoto, Musashino, Japan

[73] Assignee: Nippon Telegraph and Telephone Public Corporation, Tokyo, Japan

[21] Appl. No.: 20,644

[22] Filed: Mar. 15, 1979

Related U.S. Application Data

[63] Continuation of Ser. No. 851,272, Nov. 14, 1977, abandoned, which is a continuation of Ser. No. 619,391, Oct. 3, 1975, abandoned.

[30] Foreign Application Priority Data

Jul. 10, 1974 [JP] Japan .................................. 49-115396

[51] Int. Cl.² ............................................. H01L 29/74
[52] U.S. Cl. ......................................... 357/35; 357/36
[58] Field of Search ..................... 357/22, 35, 36, 92, 357/21

[56] References Cited

U.S. PATENT DOCUMENTS

| 3,463,977 | 8/1969 | Grove et al. | 357/52 |
| 3,855,609 | 12/1974 | Magdo et al. | 357/35 |
| 3,936,856 | 2/1976 | Magdo | 357/35 |
| 4,075,039 | 2/1978 | Sloan | 357/44 |
| 4,076,556 | 2/1978 | Agraz-Guerena et al. | 357/35 |

OTHER PUBLICATIONS

H. Lin et al., "Lateral Compl. Trans. Str. For Simult. Fab. of Funct. Blocks," Proc. IEEE, Dec. 1964, pp. 1491–1495.
T. Frederiksen et al., "Our Advancing Technology—Transistor Advances," Motorola Monitor, vol. 8 #1, Apr. 1970, pp. 24,25.

Primary Examiner—Joseph E. Clawson, Jr.
Attorney, Agent, or Firm—Marshall & Yeasting

[57] ABSTRACT

A semiconductor device in the nature of a bipolar transistor, which is formed on a low resistance substrate, comprises regions serving as emitter and collector separated by a gate region, the emitter and collector regions being separated from and encompassed by a surrounding region that may be maintained at a selected potential relative to the encompassed regions.

1 Claim, 16 Drawing Figures

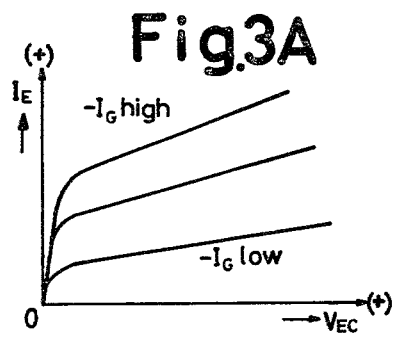
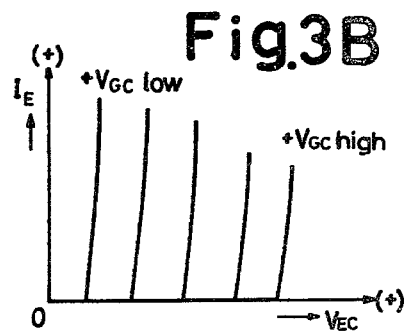
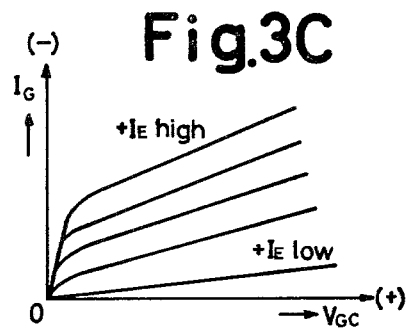
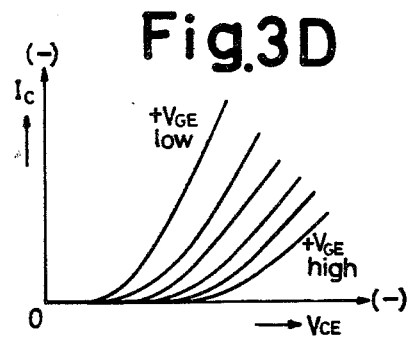
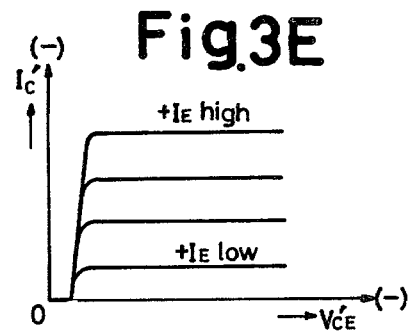

LATERAL TRANSISTOR WITH MULTI-BASE CONTACTS

This is a continuation of application Ser. No. 851,272 filed Nov. 14, 1977 which was a continuation of Ser. No. 619,391, filed 10-3-75, both abandoned.

BACKGROUND OF THE INVENTION

1. Field of the Invention

This invention relates to a semiconductor device which is similar in construction to a lateral bipolar transistor and performs functions similar to those of the latter.

2. Description of the Prior Art

There have heretofore been proposed bipolar and MIS transistors. The bipolar transistors are classified into those of lateral construction and those of vertical construction.

In general, the construction of the lateral bipolar transistor is such that a semiconductor substrate serving as a base region has formed therein as by diffusion from the upper surface thereof an emitter and a collector region which are opposite in conductivity type to the substrate and that the semiconductor substrate serving as the base region and the emitter and collector regions have deposited thereon base, emitter and collector electrodes, respectively. On the other hand, the construction of the vertical bipolar transistor is generally such that a semiconductor substrate serving as a collector region has formed therein as by diffusion from the upper surface thereof a base region opposite in conductivity type to the substrate, that the base region has formed therein as by diffusion from the upper surface thereof an emitter region opposite in conductivity type to the base region and that the semiconductor substrate serving as the collector region and the base and emitter regions have deposited thereon collector, base and emitter electrodes, respectively.

Further, the MIS transistor is usually composed of a semiconductor substrate of one conductivity type, source and drain regions opposite in conductivity type to the substrate and formed in the substrate as by diffusion from the upper surface of the substrate, an insulating layer deposited on the semiconductor substrate at least between the source and drain regions, and gate, source and drain electrodes deposited on the insulating layer and the source and drain regions, respectively.

Thus, whether it is lateral or vertical, the bipolar transistor has such an advantage that it can be produced easily as compared with the MIS transistor because its manufacture does not involve the step for the formation of the thin insulating layer on the gate electrode which is necessary for the MIS transistor. Moreover, in the lateral bipolar transistor, the emitter and collector regions can be formed simultaneously in the semiconductor substrate serving as the base region, so that the lateral bipolar transistor can be produced with more ease than the vertical bipolar transistor that the emitter region is formed in the base region after the formation of the latter in the semiconductor substrate serving as the collector region.

Further, since the base and emitter regions of the lateral bipolar transistor has the photodiode construction, the lateral bipolar transistor has the function of a photoelectric conversion element in addition to the functions of an amplifying element and a switching element, as is the case with the MIS transistor. Accordingly, by forming many lateral bipolar transistors on a common semiconductor substrate in the so-called monolithic manner, a large-scale logic circuit or a sensor of image pickup apparatus can be constructed.

However, the conventional lateral bipolar transistor has such a construction that minority carriers injected from the emitter region into the base region in the operative state of the transistor unnecessarily spread into other parts than that of the base region defined between the emitter and collector regions. This introduces such a defect that, for example, in the case of forming a plurality of lateral bipolar transistors on a common semiconductor substrate, the operation of each transistor affects those of the others.

Accordingly, in the case of forming a monolithic logic circuit or a sensor of image pickup apparatus with a plurality of conventional lateral bipolar transistors, it is necessary to provide means for electrically isolating them from one another. This inevitably increases the number of manufacturing steps of the integrated logic circuit or the sensor of image pickup apparatus and makes it bulky.

SUMMARY OF THE INVENTION

Accordingly, this invention is to provide a novel semiconductor device which is similar in construction to the conventional lateral bipolar transistor and performs functions similar to those of it but is free from the abovesaid defects experienced in the past.

The semiconductor device of this invention has a construction similar to that of the conventional lateral bipolar transistor and achieves the functions of an amplifying element, a switching element and a photoelectric conversion element as is the case with the conventional lateral bipolar transistor. However, unlike the conventional lateral bipolar transistor, the semiconductor device of this invention is constructed so that minority carriers injected from the emitter region into the base region in the operative state of the device do not spread unnecessarily into other parts than that of the base region defined between the emitter and collector regions. Accordingly, in the case of forming a plurality of semiconductor devices on a common semiconductor substrate, there is no possibility that the operation of each of the semiconductor devices exerts an influence on the operations of the other devices.

Moreover, since the minority carriers do not spread unnecessarily, the semiconductor device achieves its operation at high speed, as compared with the conventional lateral bipolar transistor.

Further, this invention is to provide a novel semiconductor device which is suitable for constructing a logic circuit or a sensor of image pickup apparatus by forming a plurality of semiconductor devices on a common semiconductor substrate in a monolithic manner.

The semiconductor device of this invention has such a construction that the minority carriers injected from the emitter region into the base region during the operation of the device do not spread unnecessarily into other parts than that of the base region defined between the emitter and collector regions as described previously. Accordingly, in the case where a logic circuit or a sensor of image pickup apparatus is constructed by forming a plurality of such semiconductor devices on a common semiconductor substrate in the monolithic manner, there is no need of providing means for electrically isolating the semiconductor devices from one another. Consequently, such a logic circuit or sensor of image pickup apparatus can be obtained relatively easily and without increasing its dimensions.

Other objects, features and advantages of this invention will become apparent from the following description taken in conjunction with the accompanying drawings.

BRIEF DESCRIPTION OF THE DRAWINGS

FIGS. 3A to 3D, inclusive, are graphs showing characteristics of the semiconductor device of this invention illustrated in FIGS. 1 and 2;

FIG. 3F is a graph showing characteristics of another example of the semiconductor device of this invention depicted in FIG. 4;

DESCRIPTION OF THE PREFERRED EMBODIMENTS

Figure 1:
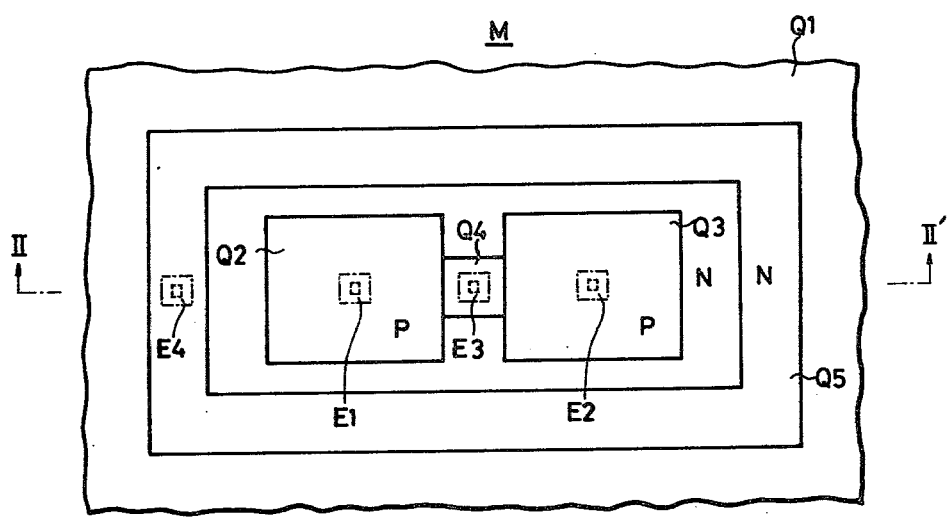
FIG. 1 is a schematic plan view illustrating one example of a semiconductor device according to this invention.
Figure 2:
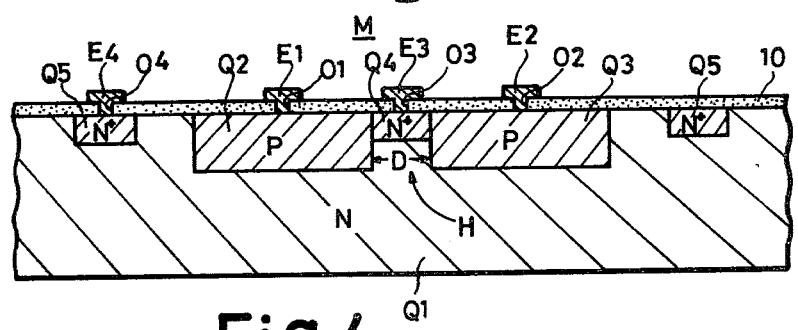
FIG. 2 is a cross-sectional view taken along the line II—II' in FIG. 1.

FIGS. 1 and 2 show a first embodiment of a semiconductor device of this invention, which is indicated generally by M. The semiconductor device M has a first semiconductor region Q1 formed of, for example, an N type silicon substrate having a resistivity of, for example, about 20 to 500 $\Omega$cm. The region Q1 has P type second and third semiconductor regions Q2 and Q3 formed, for example, by diffusion from the side of the upper surface of the substrate. In this case, the distance D between the inner sides of the regions Q2 and Q3 is selected to be, for example, about less than 10 $\mu$m. Further, the region Q1 has an N type fourth semiconductor region Q4 formed, for example, by diffusion from the side of the upper surface of the substrate to extend between the regions Q2 and Q3. In this case, the resistivity of the region Q4 is selected to be lower than that of the region Q1, for example, about 5 to 10 $\Omega$/cm$^2$ in terms of sheet resistance. Accordingly, the region Q4 is indicated by N+. Moreover, the region Q1 has an N type fifth semiconductor region Q5 formed, for example, by diffusion from the side of the upper surface of the substrate to encompass the regions Q2, Q3 and Q4. In this case, the resistivity of the region Q5 is selected to be substantially equal to that of the region Q4 and the area of the region Q5 is selected to be larger than that of the region Q4. The regions Q1 to Q5 are covered with an insulating layer 10 as of SiO$_2$, which has windows 01, 02, 03 and 04 formed at those positions corresponding to the regions Q2, Q3, Q4 and Q5. Through these windows 01, 02, 03 and 04, first, second, third and fourth electrodes E1, E2, E3 and E4 are respectively deposited on the regions Q2, Q3, Q4 and Q5 to make ohmic contact therewith.

The above is the first embodiment of the semiconductor device of this invention. With such a construction, it is apparent that the regions Q1, Q2 and Q3 correspond to the base, emitter and collector regions of a lateral bipolar transistor, respectively, and that the electrodes E1 and E2 correspond to the emitter and collector electrodes. Accordingly, the regions Q1, Q2 and Q3 will hereinafter be respectively referred to as base, emitter and collector regions, too, and the electrodes E1 and E2 will hereinafter be also referred to as emitter and collector electrodes, respectively. On the other hand, since the electrode E4 makes ohmic contact with the N+ type region adjoining the N type region Q1, it is evident that this electrode E4 corresponds to the base electrode of the lateral bipolar transistor. Accordingly, the electrode E4 will hereinafter be referred to as the base electrode, too.

Consequently, if the semiconductor device of the construction described above in connection with FIGS. 1 and 2 is not provided with the region Q4 and the electrode E3, it is exactly identical in construction with the conventional lateral bipolar transistor and has exactly the same functions as the latter. However, since the semiconductor device of FIGS. 1 and 2 according to this invention has the region Q4 and the electrode E3, it has a construction similar to that of the conventional lateral bipolar transistor and has functions similar to those of the latter. However, it must be appreciated that such similar functions are accompanied by effects which cannot be obtained with the conventional lateral bipolar transistor.

That is, since the electrode E3 is in ohmic contact with the N+ type region contiguous to the N type base region Q1 as is the case with the base electrode E4, it corresponds to the base electrode of the conventional lateral bipolar transistor. However, the area of the region Q4, with which the electrode E3 is coupled in the ohmic contact manner, is sufficiently smaller than that of the N+ type region Q5 with which the base electrode E4 is in ohmic contact, so that where a DC bias voltage is applied between the electrodes E4 and E3 to make the potential of the former higher than that of the latter, an electric field established between the regions Q5 and Q4 of the base region Q1 centers on the part underlying the region Q4. As a result of this, it can be regarded that an equivalent resistance spreading from the part under the region Q4 in three-dimensional manner is connected between the electrodes E4 and E3. Such an effect is referred to as a spreading resistance effect by the region Q4. Further, the so-called high-low junction is formed between the region Q4 and the part of the region Q1 underlying it, so that the part of the region Q1 underlying the region Q4 has the lowest potential in the region Q1 and this potential is lower than that of the region Q4. The part of the region Q1 underlying the region Q4 will hereinafter be referred to as the channel. The electrode E3 will hereinafter be referred to as the gate electrode in order to distinguish from the electrode E4 referred to as the base electrode. Accordingly, by putting the semiconductor device of this invention in the same operative state as that of the conventional lateral bipolar transistor except the application of a DC bias voltage between the base and gate electrodes E4 and E3 to make the potential of the former higher than that of the latter, minority carriers injected from the emitter region Q2 to the side of the base region Q1 center on the channel H in the base region 01.

Accordingly, with the semiconductor device of the construction described with regard to FIGS. 1 and 2, it is possible to obtain the same function as that of the conventional lateral bipolar transistor only in the region surrounded by the N+ type region Q5. Therefore, even where a plurality of semiconductor devices of this invention are constructed on a common semiconductor substrate Q1, there is no possibility that each of the semiconductor devices has substantial influence on the others. Further, if the resistivity of the base region Q1 is selected to be relatively high, and hence if the resistivity of the channel H is selected to be relatively high, and if the length D of the channel H is selected to be short, the channel H in the base region Q1 for the minority carriers extends into a depletion layer of the PN junction between the base and collector regions Q1 and Q3 in the operative state of the semiconductor device. As a result of this, the minority carriers injected into the channel H are drifted by an electric field of high intensity. Consequently, the functions similar to those of the conventional lateral bipolar transistor can be obtained at high speed.

FIG. 3A shows characteristic curves of the semiconductor device M of this invention depicted in FIGS. 1 and 2 that the relationships of a current $I_E$ flowing in the emitter electrode E1 towards the emitter region Q2 to a voltage $V_{EC}$ of the emitter electrode E1 on the basis of a voltage of the collector electrode E2 were measured using, as a parameter, a current $I_G$ flowing in the gate electrode E3 towards the region Q4.

It is apparent from FIG. 3A that if the gate current $I_G$ is regarded as a base current of the conventional lateral bipolar transistor, if the emitter and base electrodes E1 and E3 are used as a common electrode, if a load is connected to the collector electrode E2 through a required DC bias power source and if a signal current source is connected to the gate electrode E3 through a required DC bias power source, it is possible with the semiconductor device M of this invention to obtain the function of an amplifying element similar to a conventional PNP type bipolar transistor.

FIG. 3B shows the relationships of the current $I_E$ flowing in the emitter electrode E1 to the voltage $V_{EC}$, which were measured using, as a parameter, a voltage $V_{GC}$ of the gate electrode E3 on the basis of the voltage of the collector electrode E2.

It is evident from FIG. 3B that, for example, if one bias power source is connected to the base electrode E4 with the collector electrodes E2 being used as a common electrode, if a load is connected to the emitter electrode through another bias power source and if a switching signal source is connected to the gate electrode E3, if necessary, through another bias source, the semiconductor device M of this invention performs the function of a switching element similar to the conventional lateral bipolar transistor.

FIG. 3C shows the relationships of the current $I_G$ to the voltage $V_{GC}$ measured using the current $I_E$ as a parameter.

It is seen from FIG. 3C, too, that, for example, if one bias power source is connected to the base electrode E4 with the collector electrode E2 being used as a common electrode, if a load is connected to the gate electrode E3 through another bias power source and if a signal source is connected to the emitter electrode E1 through another bias power source, the semiconductor device M of this invention achieves the function of an amplifying element.

In the case where the collector voltage of the present semiconductor device is selected to be high in the negative direction as compared with the base voltage, punch-through occurs between the emitter and collector. FIG. 3D shows characteristic curves of the semiconductor device M of this invention that the relationships of the current $I_C$ flowing in the collector electrode E2 towards the region Q3 to the collector voltage $V_{CE}$ on the basis of the voltage of the emitter electrode E1 were measured using, as a parameter, a voltage $V_{GE}$ which is a voltage of the gate electrode E3 on the basis of the voltage of the emitter electrode E1.

From FIG. 3D, too, it is apparent that, for example if a load is connected to the collector electrode E2 through a required bias power source with the emitter and base electrodes being used as a common electrode and if a signal voltage source is connected to the gate electrode E3, the semiconductor device M of this invention achieves the function of a punch-through element of the conventional lateral bipolar transistor.

Further, it is evident that where the distance D between the emitter and collector regions is short, for example, about less than 1 μm, even if the collector voltage is not so high in the negative direction, as compared with the base voltage, such a punch-through characteristic as shown in FIG. 3D is observed.

Figure 4:
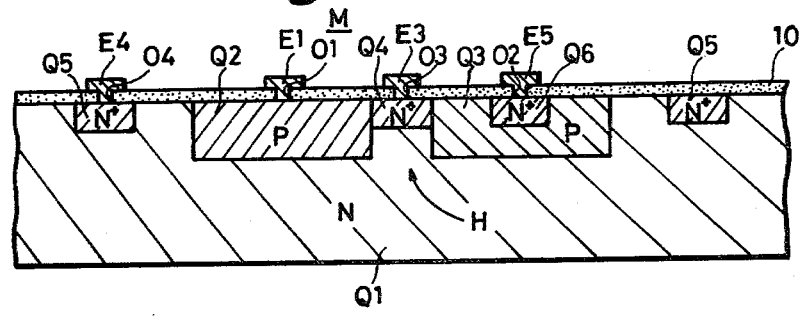
FIGS. 4, 5, 6, 7, 8, 9 and 10 are cross-sectional views schematically illustrating other examples of the semiconductor device of this invention.

Referring now to FIG. 4, a second embodiment of this invention will be described. In the present embodiment, parts corresponding to those in FIGS. 1 and 2 are marked with the same reference numerals and characters and no detailed description will be given of them. The illustrated embodiment is identical in construction with the embodiment of FIGS. 1 and 2 except that the electrode E2 is left out, that an N type region Q6 having a resistivity lower than that of the region Q1 is formed in the region Q3 by diffusion from the side of the upper surface thereof and that an electrode E5 is deposited on the region Q6 to make ohmic contact therewith.

Such a construction is identical with that of FIGS. 1 and 2 except that the region Q3 in FIGS. 1 and 2 corresponding to the collector region of the bipolar transistor and the electrode E2 of the region Q3 become the so-called hooked structure comprising the regions Q3 and Q6 and the electrode E5, though not described in detail. Accordingly, it is seen that the same functions as those described previously in connection with FIGS. 1 and 2 can be obtained. However, since the collector region is the hooked collector region, when the semiconductor device M of FIG. 4 is employed as an amplifying element, it is possible to obtain a high amplification degree as compared with that obtainable with the semiconductor device M of FIGS. 1 and 2.

FIG. 3E shows characteristic curves of the semiconductor device M of FIG. 4, obtained by measuring the relationships of a current $I_C'$, to a voltage $V_{CE}'$, with the current $I_E$ used as a parameter. In FIG. 3E, the voltage $V_{CE}'$, is a voltage of the electrode E5 on the basis of the voltage of the emitter electrode E1 and the current $I_C'$, is a current flowing in the electrode E5 towards the region Q6.

Also from this graph, it is evident that, for example, if the base electrode E4 is used as a common electrode, if a load is connected to the collector electrode E5 through one bias power source, if another bias power source is connected to the gate electrode E3 and if a signal source is connected to the emitter electrode E1 through another bias power source, the semiconductor device M of FIG. 4 performs as an amplifying element having a high amplification degree as compared with the semiconductor device M of FIGS. 1 and 2.

Figure 5:
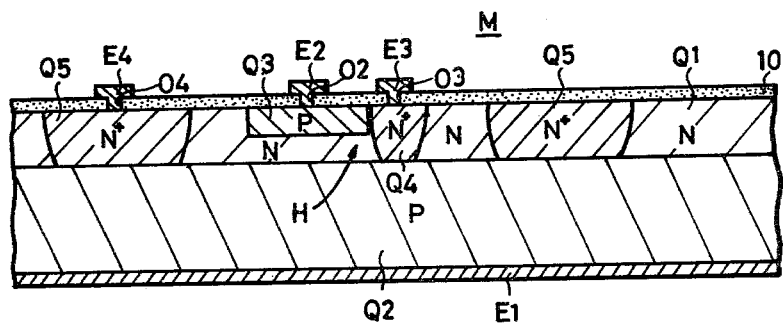

Turning now to FIG. 5, a third embodiment of this invention will be described. In FIG. 5, parts corresponding to those in FIGS. 1 and 2 are identified by the same reference numerals and characters. The illustrated embodiment has the construction which comprises a region Q2 formed of, for example, a P type substrate, an N type region Q1 formed, for example, by epitaxial growth, on the region Q2, a P type region Q3 formed in the region Q1, for example, by diffusion from the side of the upper surface thereof, an $N^{30}$ type region Q4 formed, for example, by diffusion from the side of the upper surface of the region Q1 to extend between the regions Q2 and Q3 and having a lower resistivity than the region Q1, an $N^{30}$ type region Q5 formed, for example, by diffusion from the side of the upper surface of the region Q1 to encompass the regions Q3 and Q4 and to extend down to the region Q2 and having a lower resistivity than the region Q1, and electrodes E1, E2, E3 and E4 deposited on the regions Q2, Q3, Q4 and Q5, respectively. In this case, the area of the region Q4 is sufficiently smaller than that of the region Q5, as is the case with FIGS. 1 and 2.

As is apparent from a comparison of such a construction with the construction of FIGS. 1 and 2, the regions Q1, Q2 and Q3 correspond to the base, emitter and collector regions of the bipolar transistor, respectively, and the electrodes E1 and E2, the electrode E3 and the electrode E4 correspond to the emitter, collector and base electrodes, respectively. Accordingly, it is possible with the semiconductor device M of FIG. 5 to obtain the same functions as those described previously with regard to FIGS. 1 and 2 although no detailed description will be given.

Figure 6:
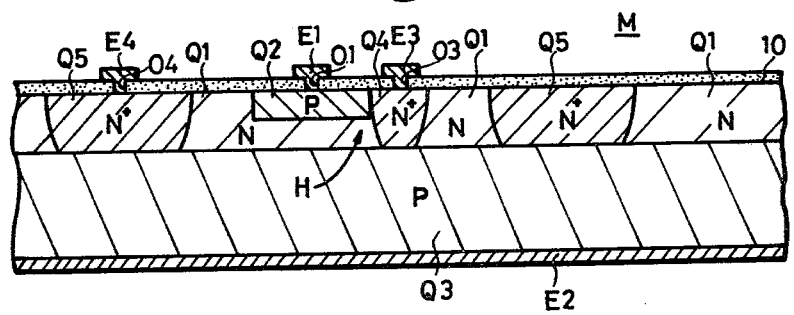

FIG. 6 illustrates a fourth embodiment of this invention, in which parts corresponding to those in FIG. 5 are identified by the same reference numerals and characters, and no detailed description will be repeated. The present embodiment is identical in construction with the semiconductor device M of FIG. 5 except that the regions Q2 and Q3 of the latter are formed as regions Q3 and Q2, respectively, and that the electrodes E1 and E2 are formed as electrodes E2 and E1, respectively.

Since such a construction is the same as that of FIG. 5 except that the regions Q2 and Q3 corresponding to the emitter and collector regions in FIG. 5, respectively, are referred to as collector and emitter regions, respectively, it is possible to obtain the same effects as those described with regard to FIG. 5, although no detailed description is given.

Turning now to FIGS. 7, 8, 9 and 10, other embodiments of this invention will be described. The embodiments of FIGS. 7, 8, 9 and 10 are identical in construction with those of FIGS. 2, 4, 5 and 6, respectively, except that the omission of the electrode E1 in the constructions described previously in connection with FIGS. 2, 4, 5 and 6. Accordingly, in the FIGS. 7, 8, 9 and 10 embodiments, parts corresponding to those in FIGS. 2, 4, 5 and 6, respectively, are identified by the same reference numerals and characters and no detailed description will be repeated.

Figure 7:
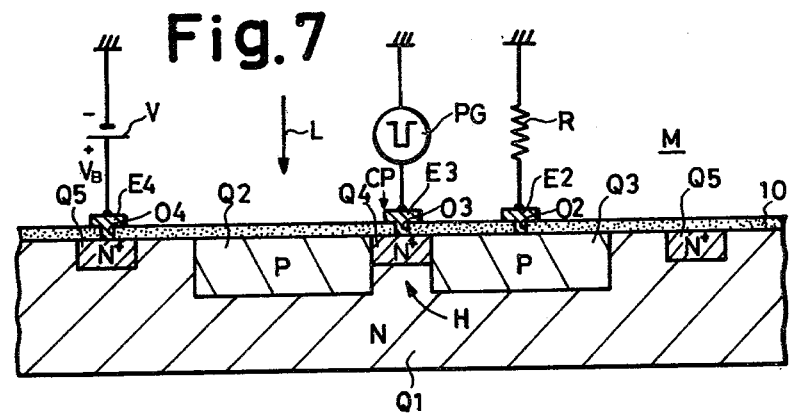
Figure 8:
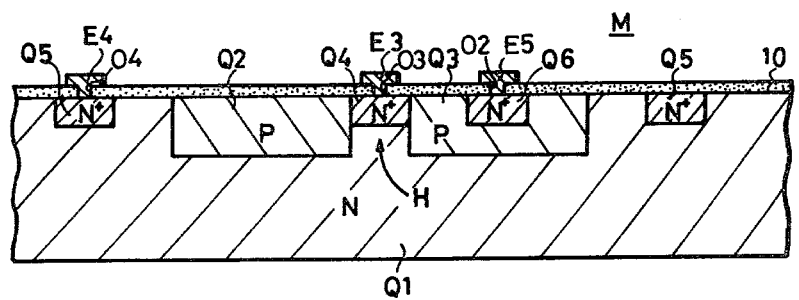
Figure 9:
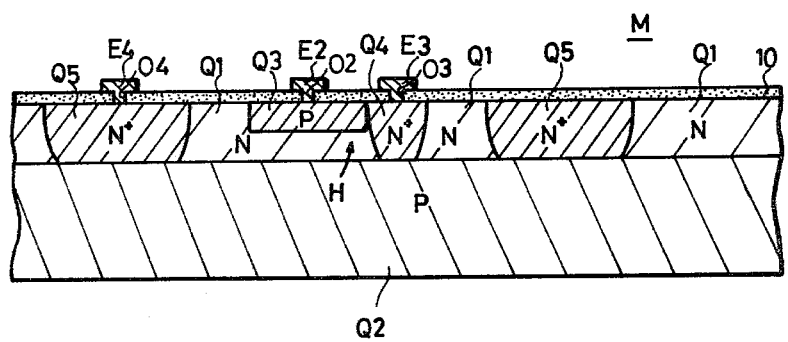
Figure 10:
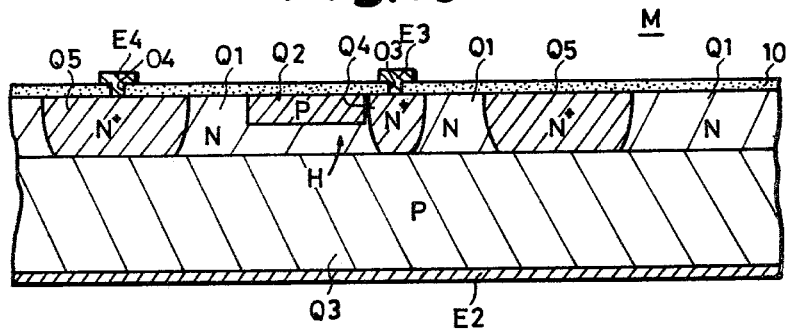

With the constructions of FIGS. 7 to 10, when a light signal is directed to at least the PN junction between the regions Q1 and Q2 in such a state that a predetermined potential is applied to the electrode E3, the light signal is stored in the PN junction between the regions Q1 and Q2. Accordingly, by applying periodic pulses to the electrode E3 to lower its potential periodically intermittently, it is possible to obtain a function of a semiconductor device having a photoelectric conversion function that the PN junction between the regions Q1 and Q2 serves as a light signal storage region. This will be explained, for example, in connection with the FIG. 7 example. As shown in FIG. 7, a load resistor R is connected between the electrode E2 (in FIG. 8, the electrode E5) and the ground; a DC power source V providing a DC voltage $V_B$ is connected between the electrode E4 and the ground; and a pulse source PG providing a periodic pulse CP which has a level lower than a voltage substantially equal to the DC voltage $V_B$, is connected between the electrode E3 and the ground. Further, a light signal is directed from the side of the region Q2 to the PN junction between the regions Q1 and Q2, as indicated by L. In such a case, in the normal high-level period in which the pulse CP is not produced and a high-level voltage is applied to the electrode E3, the voltage of the region Q2 becomes equal to the high-level voltage applied to the electrode E3, because the capacitance due to the PN junction between the regions Q1 and Q2 is charged with charges corresponding to the intensity of the light signal L. Further, in the low-level period in which the pulse CP is produced and a low-level voltage is applied to the electrode E3, the charges stored in the capacitance due to the PN junction between the regions Q1 and Q2 are momentarily discharged to the resistor R through the channel H, the collector region Q3 and the electrode E2, so that the voltage of the region Q2 momentarily becomes lower than the abovesaid high-level voltage applied to the electrode E3. Consequently, each time the pulse CP is produced, a current of the value which corresponds to the amount discharged, and accordingly the amount of light signal irradiated, can be instantaneously obtained in the resistor R.

Figure 11:
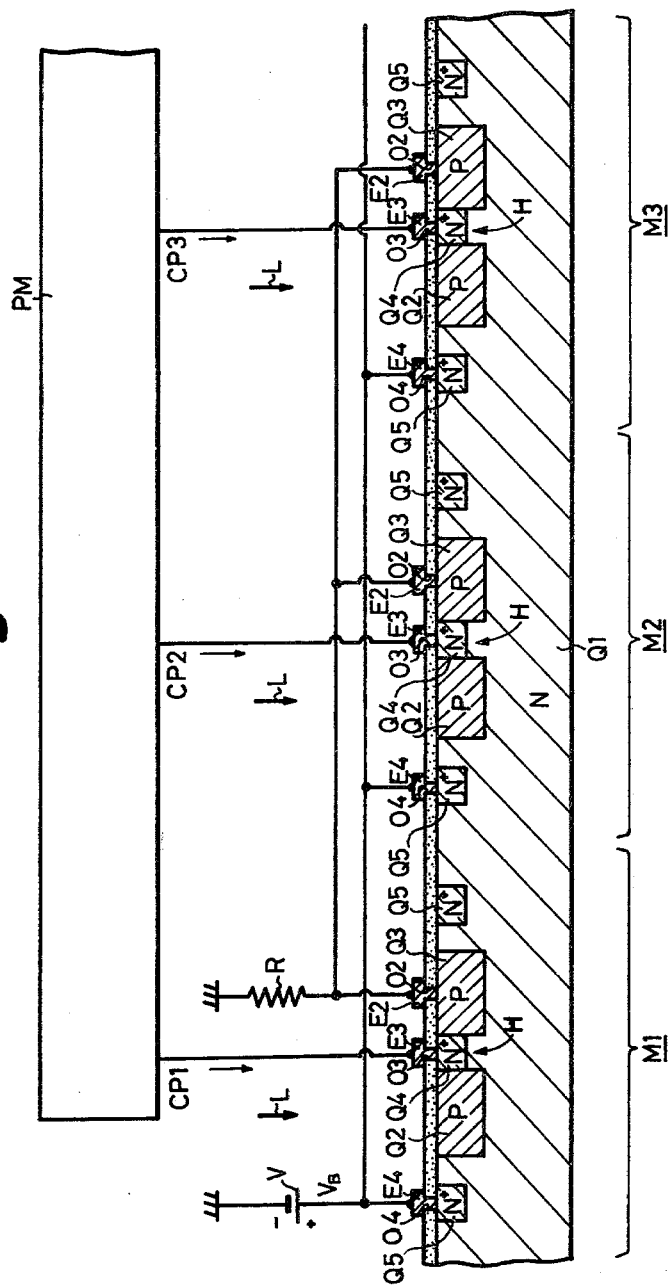
FIGS. 11 and 12 are schematic cross-sectional views respectively showing apparatus constructed with a plurality of semiconductor devices of FIG. 7 and capable of providing an electric time sequence signal indicative of a light image.

Accordingly, with the semiconductor devices of this invention shown in FIGS. 7 to 10, a photoelectric conversion function can be obtained. Therefore, by setting the semiconductor devices of FIGS. 7 to 10 in array and by scanning them in a sequential order, it is possible to construct a photoelectric conversion unit of image pickup apparatus as a whole. Namely, as shown in FIG. 11, a plurality of semiconductor devices M1, M2, . . . described previously in connection with FIG. 7, for example, are arranged side by side in a monolithic manner; the electrodes E2 of the semiconductor devices M1, M2, . . . are interconnected; a resistor R is connected between the connection point of the electrodes E2 and the ground, as described above with regard to FIG. 7; the electrodes E4 of the semiconductor devices M1, M2, . . . are connected together; a DC power source V is connected between the connection point of the electrodes E4 and the ground, as described in connection with FIG. 7; a plurality of periodic pulses CP1, CP2, . . . , which are the same as the periodic pulse CP mentioned above in connection with FIG. 7 but are sequentially displaced in phase (the phase difference in this case being substantially equal to or larger than the width of each pulse), are applied to the electrodes E3 of the semiconductor devices M1, M2, . . . , respectively, from a scanning circuit PM corresponding to the pulse source PG in FIG. 7; and the array of the plurality of semiconductor devices M1, M2, . . . , is irradiated by a light image L. With such a construction, it is possible to obtain the photoelectric conversion unit of image pickup apparatus in which an electric time sequence signal indicative of the light image L is produced by the resistor R.

Figure 12:
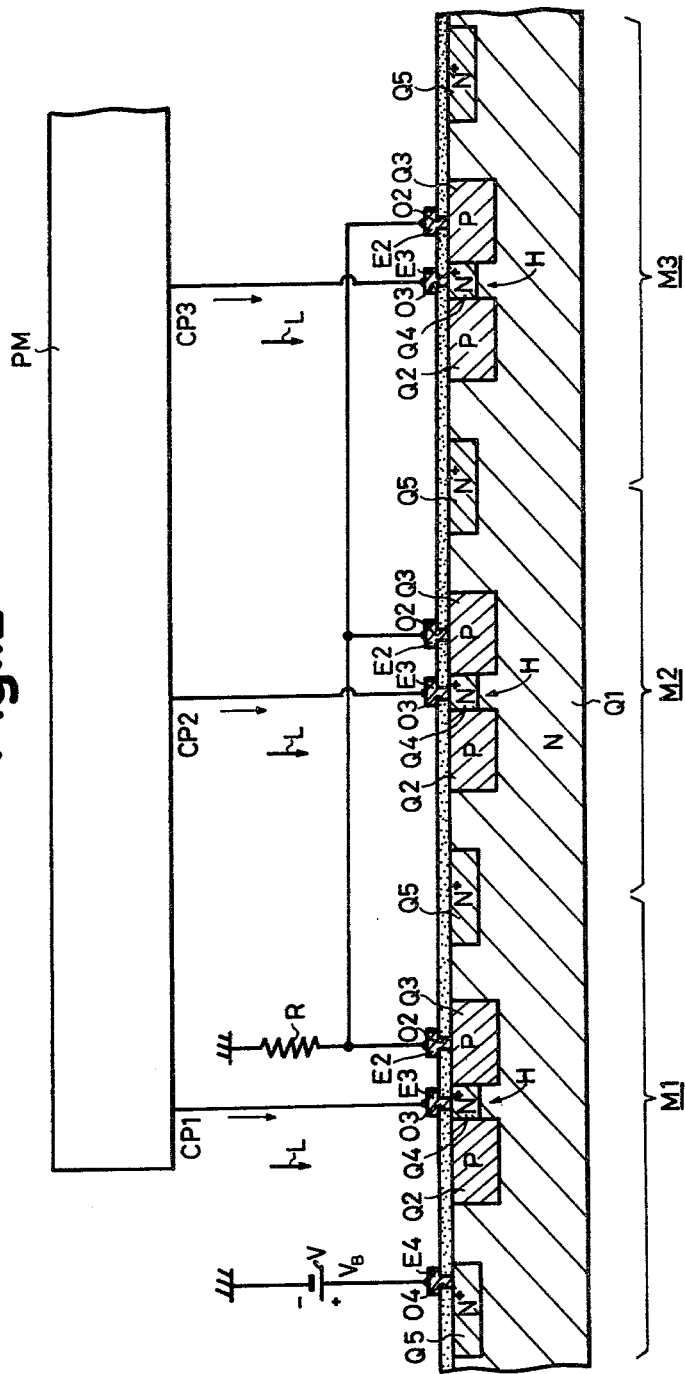

In the case of constructing the photoelectric conversion unit as depicted in FIG. 11, the electrodes E4 of the devices M1, M2, . . . can be formed as one unitary electrode common to them. Further, it is also possible to form the regions Q5 of the devices M1, M2, . . . as one unitary region common to them. This is shown in FIG. 12, in which parts corresponding to those in FIG. 11 are marked with the same reference numerals and characters and no detailed description will be repeated.

The foregoing embodiments should be construed as being merely illustrative of this invention and should not be construed as limiting the invention specifically thereto. For example, in the foregoing embodiments shown in FIGS. 2, 4, 7, 8, 11 and 12, even if the region Q5 and the electrode E4 are left out and even if an electrode of large area is provided as a substitute for the electrode E4 on the under side of the semiconductor region Q1, though not shown and described, the same functions as those described previously with regard to the respective embodiments can be obtained.

It will be apparent that many modifications and variations may be effected without departing from the scope of the novel concept of this invention.

What is claimed is:

1. A semiconductor device comprising:
    a first semiconductor region of a first conductivity type formed of a semiconductor substrate and serving as a base region of a lateral bipolar transistor;
    second and third semiconductor regions of a second conductivity type formed in the upper surface of the first semiconductor region and serving as emitter and collector regions of the lateral bipolar transistor, respectively;
    a fourth semiconductor region of the first conductivity type formed in the upper surface of the first semiconductor region to extend between the second and third regions and having a lower resistance than the first semiconductor region; and
    first and second electrodes deposited on the second and third semiconductor regions, respectively to serve as emitter and collector electrodes of the lateral bipolar transistor, respectively;
    wherein there is provided a fifth semiconductor region of the first conductivity type formed in the upper surface of the first semiconductor region to encompass the second, third and fourth semiconductor regions and having a lower resistance than the first semiconductor region;
    wherein the first semiconductor region has a resistance less than 500 ohm-cm;
    wherein there are provided third and fourth electrodes are deposited on the fourth and fifth semiconductor regions, respectively, to establish a potential difference therebetween, each of the third and fourth electrodes serving as a base electrode of the lateral bipolar transistor; and
    wherein the area of the fourth semiconductor region is very small as compared with that of the fifth semiconductor region to produce a spreading resistance effect.

* * * * *

UNITED STATES PATENT OFFICE
CERTIFICATE OF CORRECTION

PATENT NO. : 4,205,333
DATED : May 27, 1980
INVENTOR(S) : YAMAMOTO

It is certified that error appears in the above-identified patent and that said Letters Patent are hereby corrected as shown below:

Column 3 — Line 17 — Fig. "3F" should be "3E"

Column 7 — Line 6 — "$N^{30}$" should be "$N^+$"

Column 7 — Line 10 — "$N^{30}$" should be "$N^+$"

Signed and Sealed this

*Twenty-third* Day of *June 1981*

[SEAL]

*Attest:*

RENE D. TEGTMEYER

*Attesting Officer*   *Acting Commissioner of Patents and Trademarks*